(12) United States Patent
Wu et al.

(10) Patent No.: US 8,178,440 B1
(45) Date of Patent: May 15, 2012

(54) METHOD FOR FORMING A RECESS ARRAY DEVICE STRUCTURE IN A SEMICONDUCTOR SUBSTRATE

(75) Inventors: Chang Ming Wu, New Taipei (TW); Yi Nan Chen, Taipei (TW); Hsien Wen Liu, Luzhu Township (TW)

(73) Assignee: Nanya Technology Corp. (TW)

( * ) Notice: Subject to any disclaimer, the term of this patent is extended or adjusted under 35 U.S.C. 154(b) by 0 days.

(21) Appl. No.: 13/113,162

(22) Filed: May 23, 2011

(51) Int. Cl.
*H01L 21/4763* (2006.01)
(52) U.S. Cl. ............... 438/639; 438/618; 257/E21.577
(58) Field of Classification Search .............. 438/641; 257/E21.532, E21.536, E21.613
See application file for complete search history.

(56) References Cited

U.S. PATENT DOCUMENTS
2010/0216289 A1* 8/2010 Park et al. ............ 438/268
* cited by examiner

*Primary Examiner* — Cheung Lee
(74) *Attorney, Agent, or Firm* — Connolly Bove Lodge & Hutz LLP (57) ABSTRACT

The present invention relates to a method for forming a recess array device structure in a semiconductor substrate. The method includes the steps of: providing a base material including a semiconductor substrate and a first material; forming a plurality of second recesses on the semiconductor substrate; forming a second material in the second recesses; forming a metal layer on the second material and the base material, wherein the metal layer includes a first portion and a second portion; removing the second portion to form a plurality of metal layer openings; to and etching the base material according to the metal layer openings so as to form a plurality of third recesses. Accordingly, the metal layer can overcome the non-selectivity issue during the etching process.

14 Claims, 14 Drawing Sheets

METHOD FOR FORMING A RECESS ARRAY DEVICE STRUCTURE IN A SEMICONDUCTOR SUBSTRATE

TECHNICAL FIELD

The present invention generally relates to a method for forming a recess array device structure in a semiconductor substrate, and more particularly, to a method for forming a recess array device structure in a semiconductor substrate by using a metal spacer.

BACKGROUND

Due to structural simplicity, DRAMs (dynamic random access memories) can provide more memory cells per unit chip area than other types of memories such as static random access memories. A DRAM is constituted by a plurality of DRAM cells, each of which includes a capacitor for storing information and a transistor coupled to the capacitor for regulating when the capacitor is to be charged or discharged. During a read operation, a word line is asserted, turning on the transistor. The enabled transistor allows the voltage across the capacitor to be read by a sense amplifier through a bit line. During a write operation, the data to be written is provided on the bit line while the word line is asserted.

To satisfy the demand for greater memory storage, DRAM memory cells need size reduction. DRAM memory cell size can be reduced in several ways. One way is to reduce the minimum feature size of a DRAM memory cell through the advances in process technology. Another way to reduce the size of a DRAM memory cell is by designing a memory cell having a smaller feature size. For example, many DRAM chips on the market today have a memory cell size of $4F^2$, where F stands for the photolithographic minimum feature width or critical dimension (CD).

Figure 1:
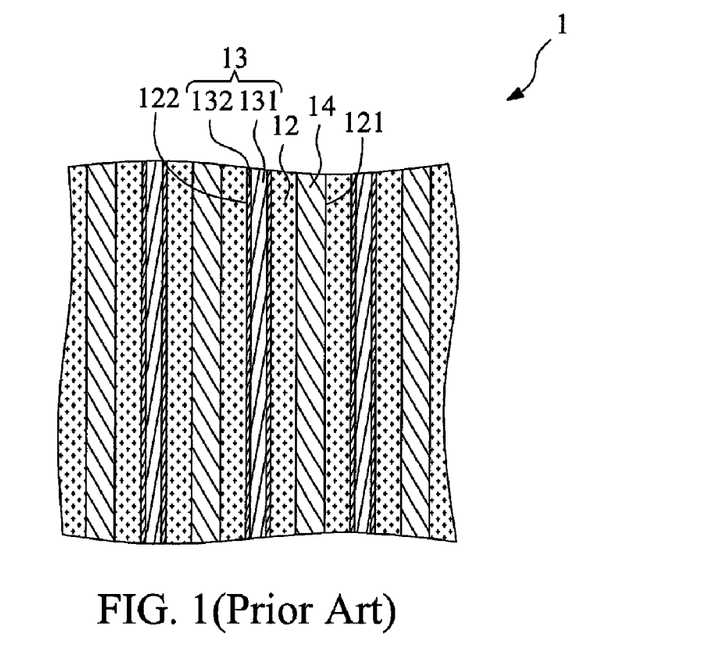
FIGS. 1 to 9 illustrate a conventional method for preparing a recess array device structure for the $4F^2$ memory cell.

Referring to FIGS. 1 to 9, a conventional method for preparing a recess array device structure for the $4F^2$ memory cell is illustrated. Referring to FIG. 1, a base material 1 is provided. It should be noted that FIG. 1 is a top view of the base material 1. The base material 1 comprises a semiconductor substrate 12, a first material 14 and an interlaying material 13. The semiconductor substrate 12 has a plurality of first recesses 121 and a plurality of interlaying recesses 122. That is, the first recesses 121 and the interlaying recesses 122 are formed on the semiconductor substrate 12 in a preceding step. The interlaying recesses 122 are parallel to the first recesses 121, and each of the interlaying recesses 122 is disposed between two first recesses 121.

The first material 14 is disposed in the first recesses 121, and the interlaying material 13 is disposed in the interlaying recesses 122. That is, the first material 14 and the interlaying material 13 are formed in a preceding step. The semiconductor substrate 12 is a silicon substrate, and the first material 14 is oxide. The interlaying material 13 includes a liner layer 132 and a center oxide 131. Usually, the liner layer 132 includes a liner oxide layer and a liner nitride layer.

Figure 2:
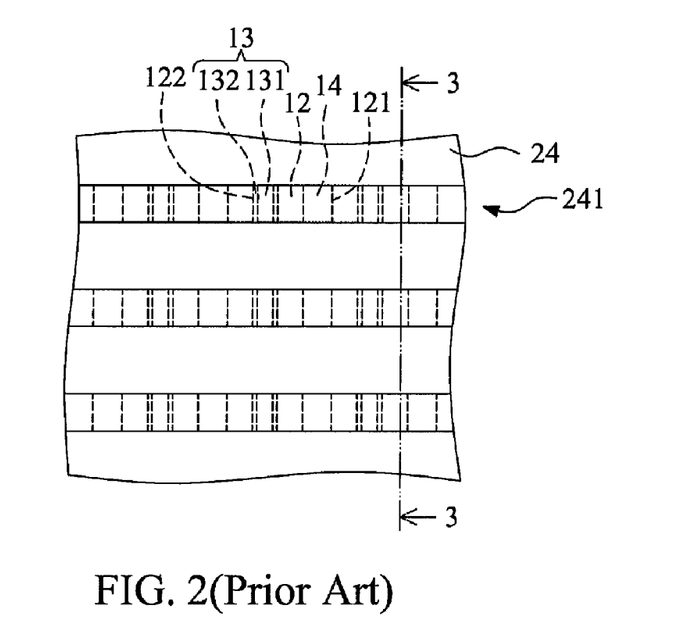
Figure 3:
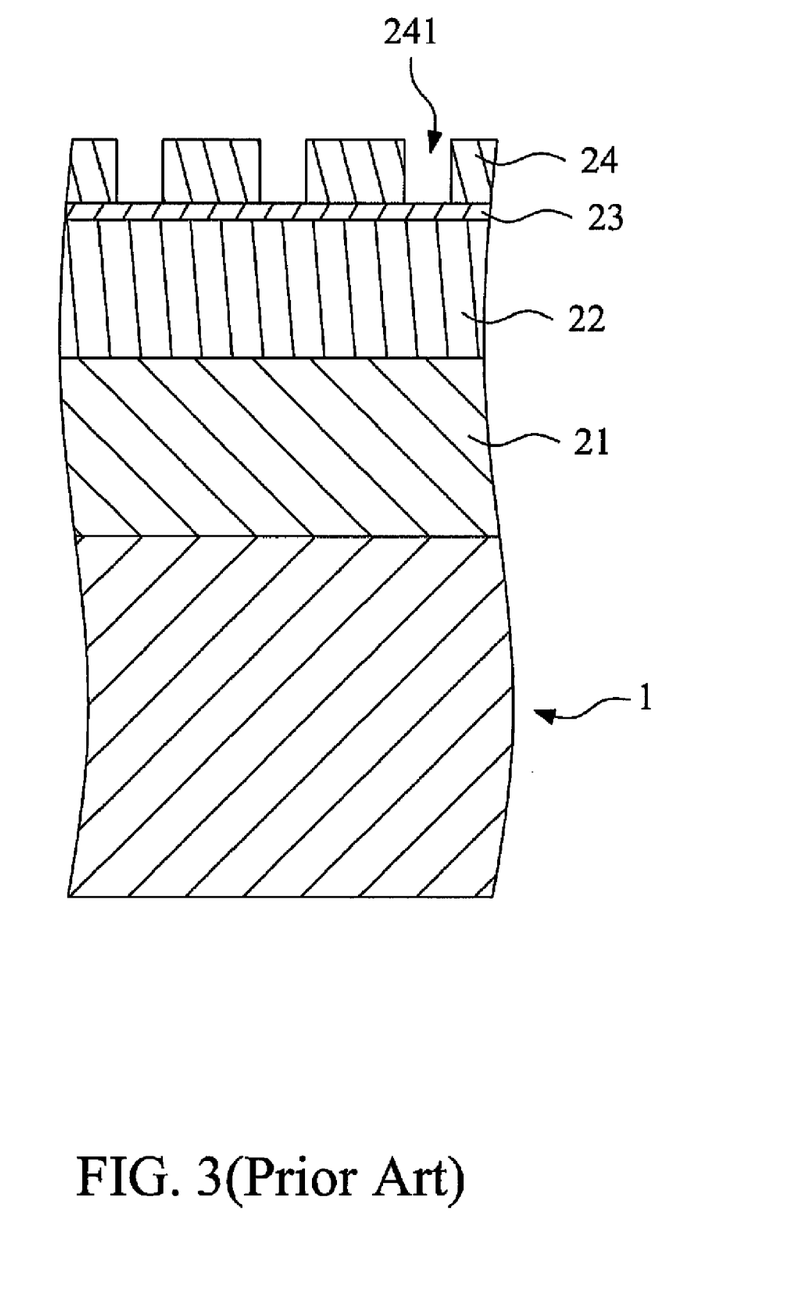

Referring to FIGS. 2 and 3, a first covering layer 21 is formed on the base material 1 to cover the semiconductor substrate 12, the first recesses 121 and the interlaying recesses 122. A second covering layer 22 is formed on the first covering layer 21. A third covering layer 23 is formed on the second covering layer 22. A photoresist layer 24 is formed on the third covering layer 23. It should be noted that FIG. 3 is a cross-sectional view of FIG. 2 taken along line 3-3. The first covering layer 21 is polysilicon, the second covering layer 22 is carbon, and the third covering layer 23 is silicon oxynitride (SiON). Next, the photoresist layer 24 is patterned to form a plurality of photoresist layer openings 241 to expose part of the third covering layer 23.

Figure 4:
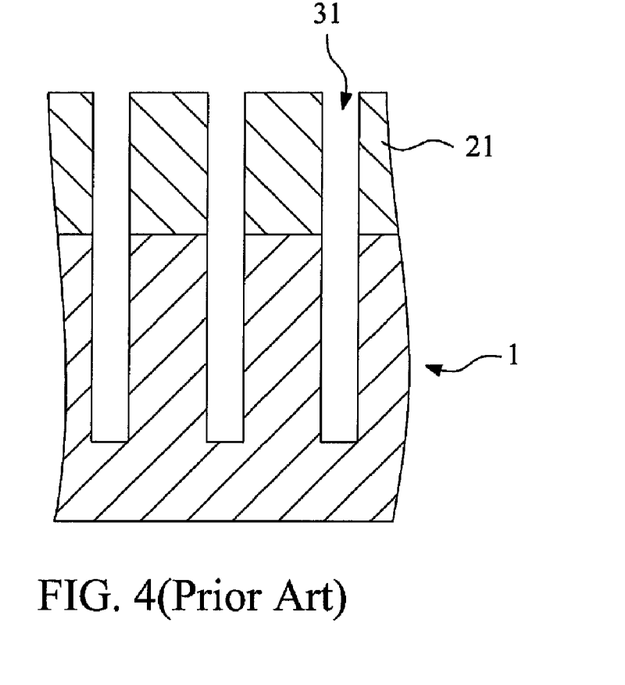

Referring to FIG. 4, the third covering layer 23, the second covering layer 22, the first covering layer 21 and the base material 1 are etched according to the photoresist layer openings 241 so as to form a plurality of second recesses 31. The second recesses 31 intersect the first recesses 121. Usually, the second recesses 31 are perpendicular to the first recesses 121 from a top view. Next, the photoresist layer 24, the third covering layer 23 and the second covering layer 22 are all removed, and the first covering layer 21 remains.

Figure 5:
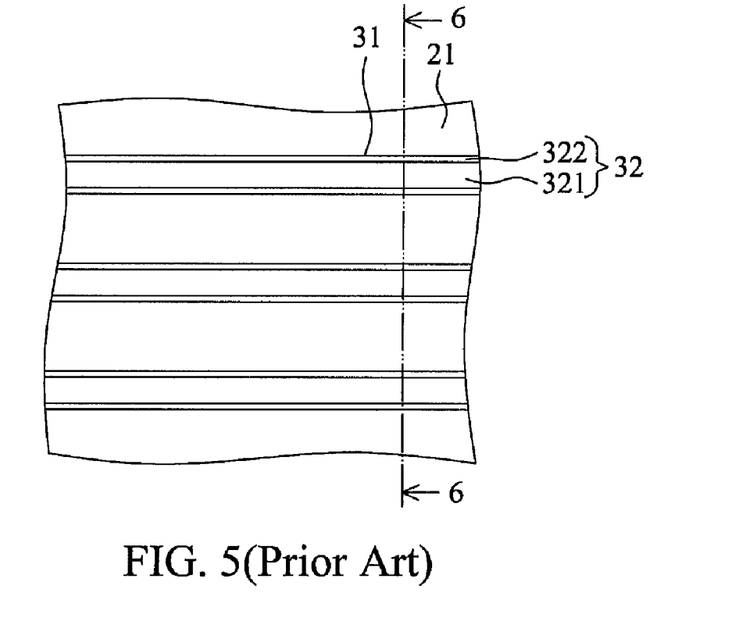
Figure 6:
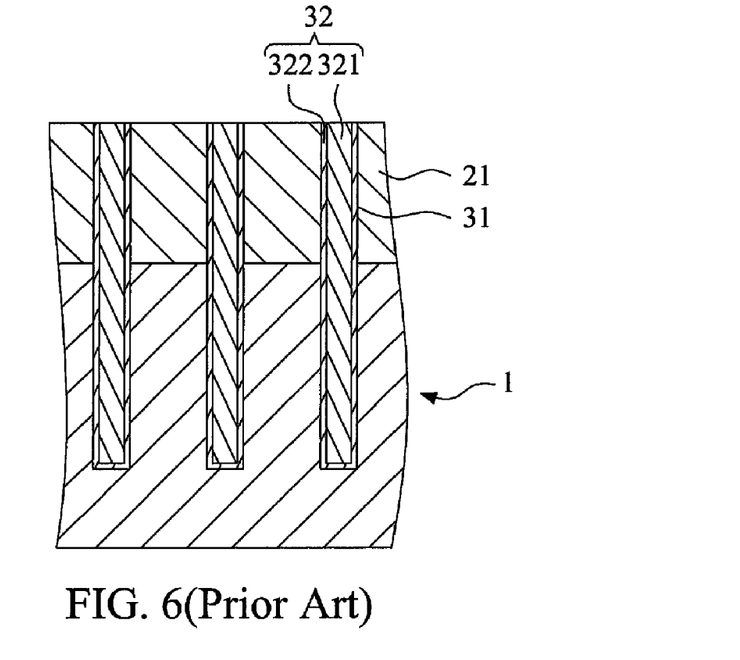

Referring to FIGS. 5 and 6, a second material 32 is formed in the second recesses 31. It should be noted that FIG. 6 is a cross-sectional view of FIG. 5 taken along line 6-6. The second material 32 includes a liner layer 322 and a center oxide 321. Usually, the liner layer 322 includes a liner oxide layer and a liner nitride layer.

Figure 7:
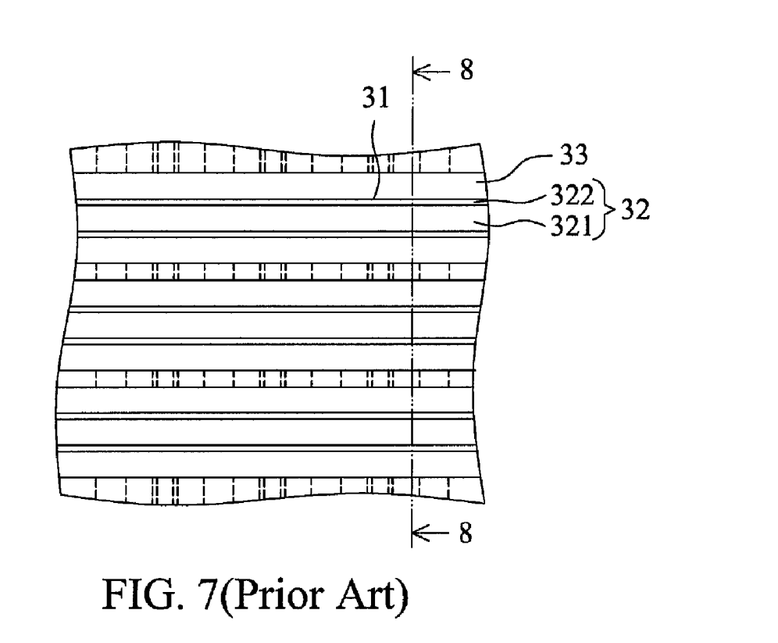
Figure 8:
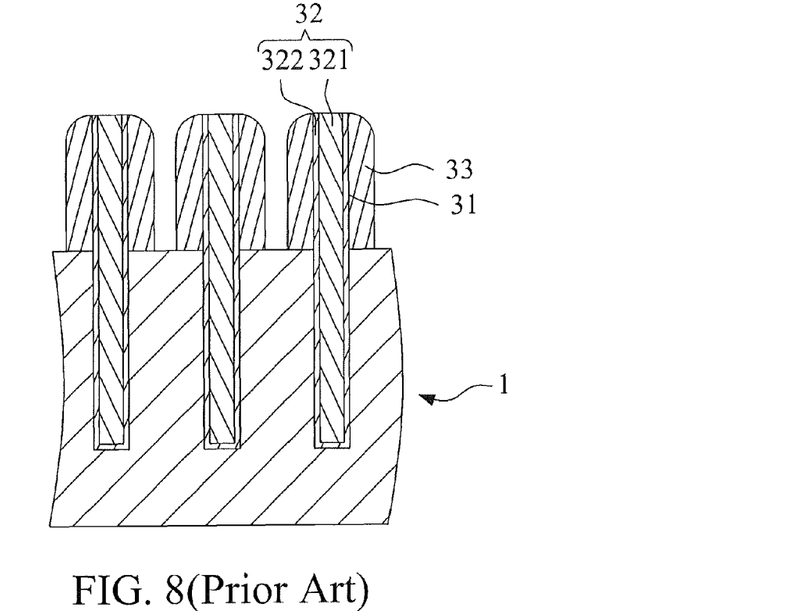

Referring to FIGS. 7 and 8, the first covering layer 21 is removed so that the second material 32 protrude from the base material 1. Next, a plurality of spacers 33 are formed on the sidewalls of the protruded second material 32. The spacers 33 is oxide or nitride.

Figure 9:
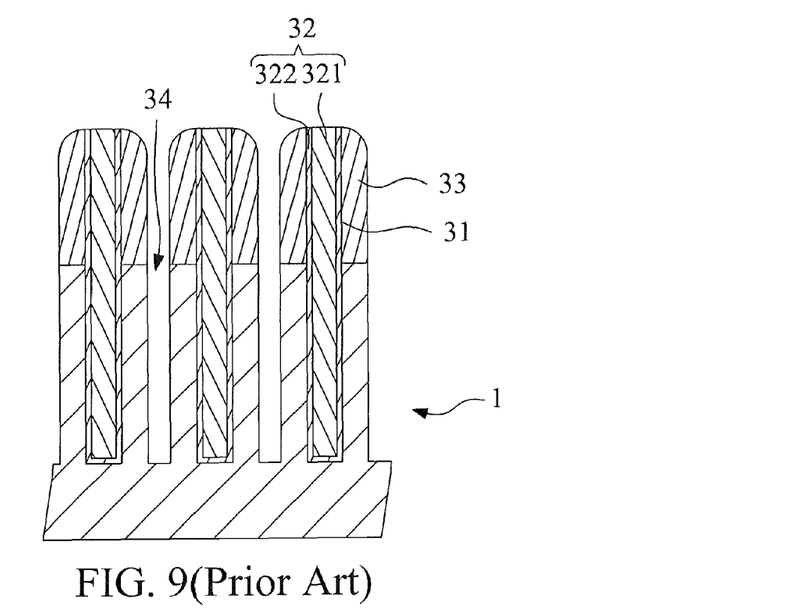

Referring to FIG. 9, the base material 1 is etched according to the gaps between the spacers 33 so as to form a plurality of third recesses 34. The third recesses 34 intersect the first recesses 121 and are parallel to the second recesses 31.

Next, the protruded second material 32 and the spacers 33 are removed. Finally, a third material (not shown) is formed in the third recesses 34. The third material 34 is oxide.

The drawback of the above-mentioned conventional method is as follows. Since the base material 1 comprises a semiconductor substrate 12 (which is silicon) and a first material 14 (which is oxide), the etching process of FIG. 9 is a non-selective etching process. It is difficult to get enough selectivity when the feature size becomes 20 nm or beyond. Further, The spacers 33 (FIG. 8) is oxide or nitride. The spacer 33 must be very tall to resist the etching gas.

SUMMARY

The present invention is directed to a method for forming a recess array device structure in a semiconductor substrate, comprising the steps of: providing a base material comprising a semiconductor substrate and a first material, the semiconductor substrate having a plurality of first recesses, the first material being disposed in the first recesses, and the first material being different from that of the semiconductor substrate; forming a plurality of second recesses on the semiconductor substrate, wherein the second recesses intersect the first recesses; forming a second material in the second recesses, wherein the second material protrudes from the base material; forming a metal layer on the protruded second material and the base material, wherein the metal layer includes a first portion and a second portion, the first portion covers the protruded second material, and the second portion covers the base material; removing the second portion of the metal layer to form a plurality of metal layer openings so as to expose the base material; and etching the base material according to the metal layer openings so as to form a plurality of third recesses, wherein the third recesses intersect the first recesses and are parallel to the second recesses.

In the present invention, the metal layer can overcome the non selectivity issue during the etching process, and the first portion of the metal layer does not need to be very tall to resist the etching gas. Further, the thickness of the first portion provides the additional mask thickness during the etching process.

In one embodiment, the second portion of the metal layer is removed by the step of applying an etching gas and an oxygen gas to the metal layer, wherein the concentration of the oxygen gas reduces gradually with height, and the concentration of the oxygen gas on the top surface of the second portion of the metal layer is zero.

In one embodiment, the second portion of the metal layer is removed by the following steps: covering a polymer layer on the first portion of the metal layer, wherein the polymer layer does not cover the second portion of the metal layer; and applying an etching gas to the metal layer to etch the second portion of the metal layer.

In one embodiment, the second portion of the metal layer is removed by the following steps: forming a silicon dioxide layer on the first portion of the metal layer, wherein the silicon dioxide layer does not cover the second portion of the metal layer; and applying an etching gas to the metal layer to etch the second portion of the metal layer.

In one embodiment, the second portion of the metal layer is removed by the following steps: forming a photoresist layer on the metal layer to cover the first portion and the second portion of the metal layer; applying a first etching gas and an oxygen gas to the photoresist layer, wherein the first etching gas is used for stripping the photoresist layer to expose the first portion of the metal layer gradually, and the exposed first portion is oxidized by the oxygen gas; stopping the first etching gas and the oxygen gas when the whole first portion is oxidized; and applying a second etching gas to etch the second portion of the metal layer. The first etching gas is a nitrogen gas, and the second etching gas is a sulfur hexafluoride ($SF_6$) gas or a nitrogen trifluoride ($NF_3$) gas.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 10:
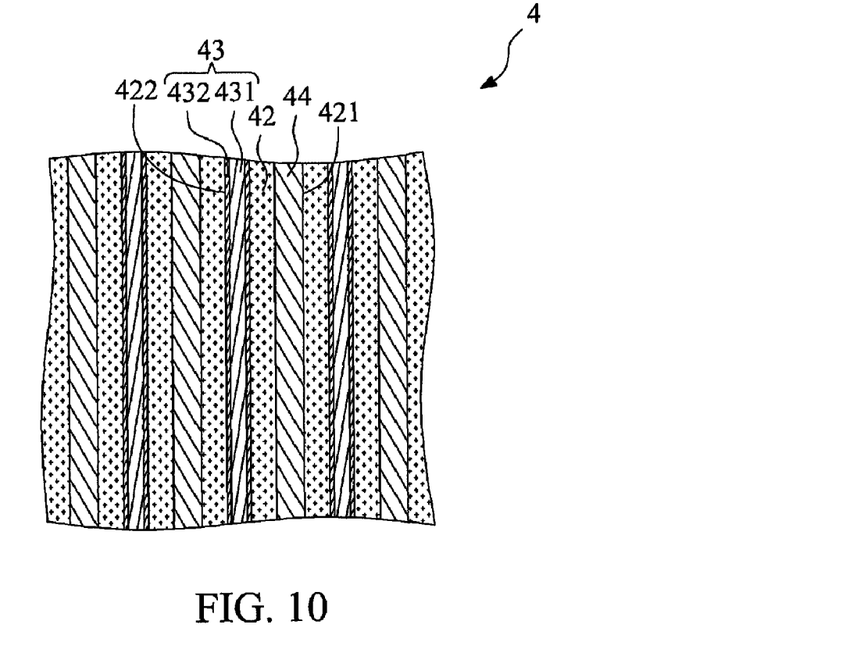
FIGS. 10 to 26 illustrate a method for preparing a recess array device structure for the $4F^2$ memory cell according to one embodiment of the present invention.

Referring to FIGS. 10 to 26, a method for preparing a recess array device structure for the $4F^2$ memory cell according to one embodiment of the present invention is illustrated. Referring to FIG. 10, a base material 4 is provided. It should be noted that FIG. 10 is a top view of the base material 4. The base material 4 comprises a semiconductor substrate 42, a first material 44 and an interlaying material 43. The semiconductor substrate 42 has a plurality of first recesses 421 and a plurality of interlaying recesses 422. That is, the first recesses 421 and the interlaying recesses 422 are formed on the semiconductor substrate 42 in a preceding step. The interlaying recesses 422 are parallel to the first recesses 421, and each of the interlaying recesses 422 is disposed between two first recesses 421.

The first material 44 is disposed in the first recesses 421, and the interlaying material 43 is disposed in the interlaying recesses 422. That is, the first material 44 and the interlaying material 43 are formed in a preceding step. The semiconductor substrate 42 is silicon, and the first material 44 is oxide. The interlaying material 43 includes a liner layer 432 and a center oxide 431. In this embodiment, the liner layer 432 includes a liner oxide layer and a liner nitride layer.

Next, a plurality of second recesses 61 (FIG. 13) are formed on the semiconductor substrate 42, and a second material 62 (FIGS. 14 and 15) is disposed in the second recesses 61. In this embodiment, the second recesses 61 and the second material 62 are formed by the following steps.

Figure 11:
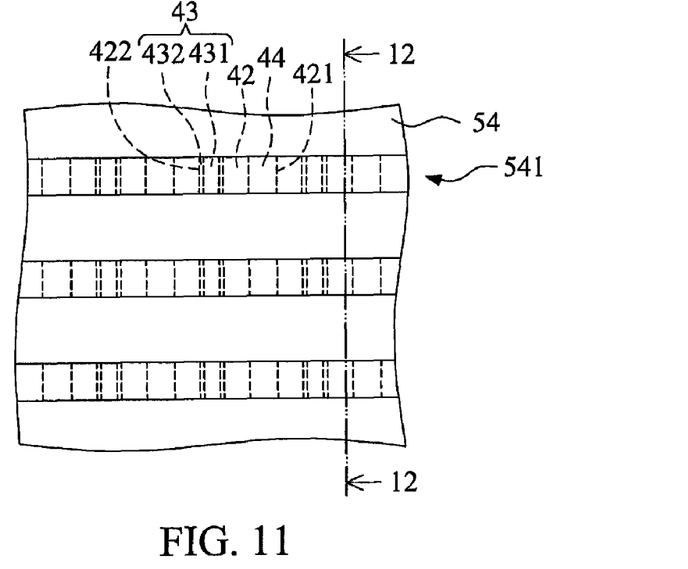
Figure 12:
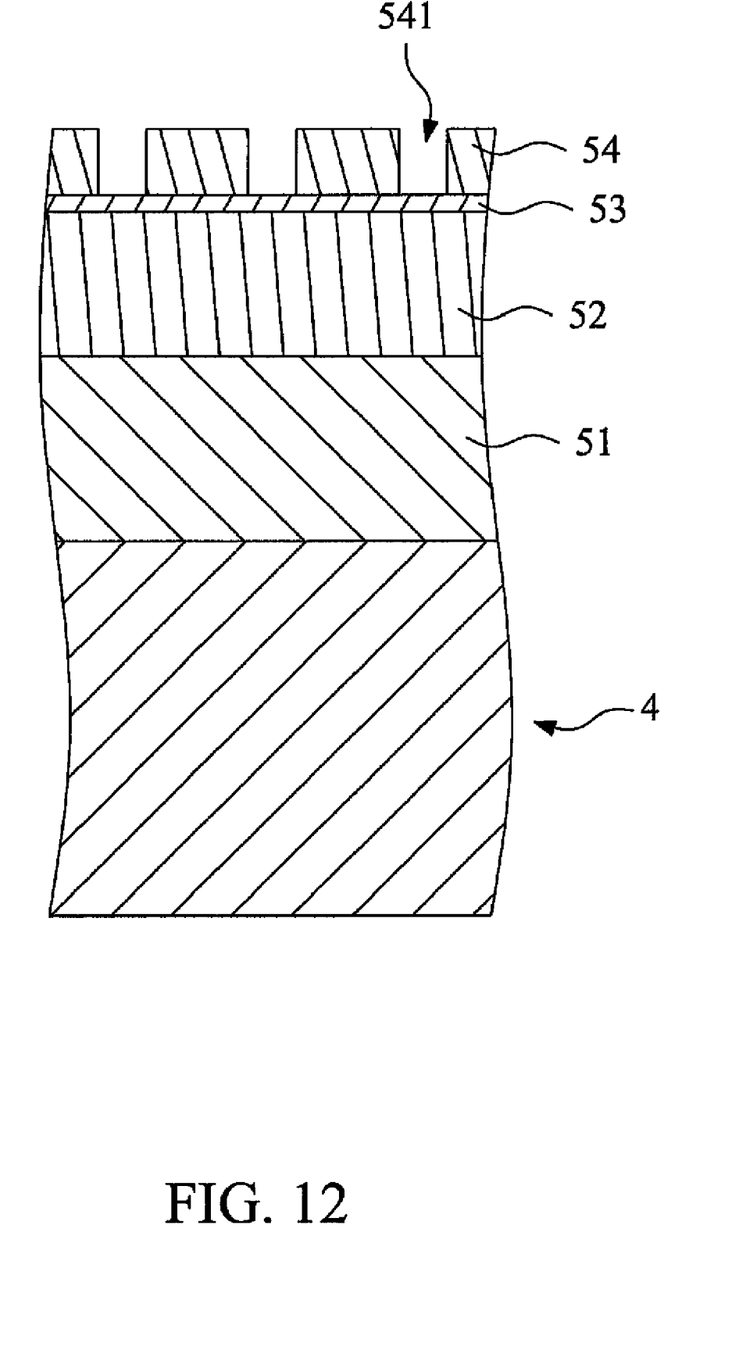

Referring to FIGS. 11 and 12, a first covering layer 51 is formed on the base material 4 to cover the semiconductor substrate 42, the first recesses 421 and the interlaying recesses 422. A second covering layer 52 is formed on the first covering layer 51. A third covering layer 53 is formed on the second covering layer 52. A photoresist layer 54 is formed on the third covering layer 53. It should be noted that FIG. 12 is a cross-sectional view of FIG. 11 taken along line 12-12. The first covering layer 51 is polysilicon, the second covering layer 52 is carbon, and the third covering layer 53 is silicon oxynitride (SiON). Next, the photoresist layer 54 is patterned to form a plurality of photoresist layer openings 541 to expose part of the third covering layer 53.

Figure 13:
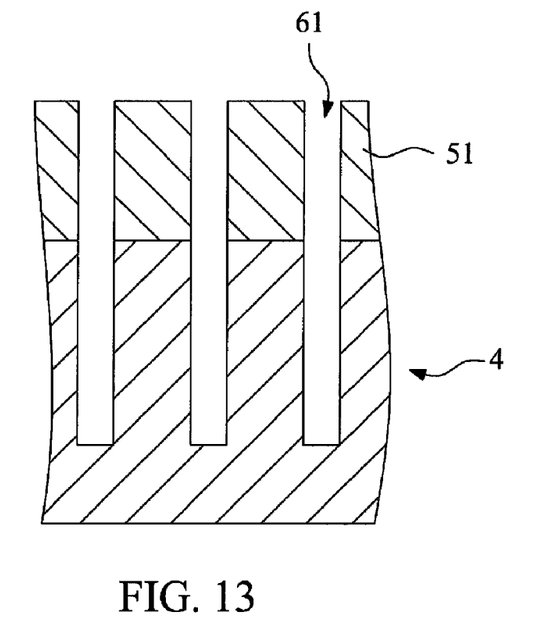

Referring to FIG. 13, the third covering layer 53, the second covering layer 52, the first covering layer 51 and the base material 4 are etched according to the photoresist layer openings 541 so as to form a plurality of second recesses 61. The second recesses 61 intersect the first recesses 421. In this embodiment, the second recesses 61 are perpendicular to the first recesses 421 from a top view. Next, the photoresist layer 54, the third covering layer 53 and the second covering layer 52 are all removed, and the first covering layer 51 remains.

Figure 14:
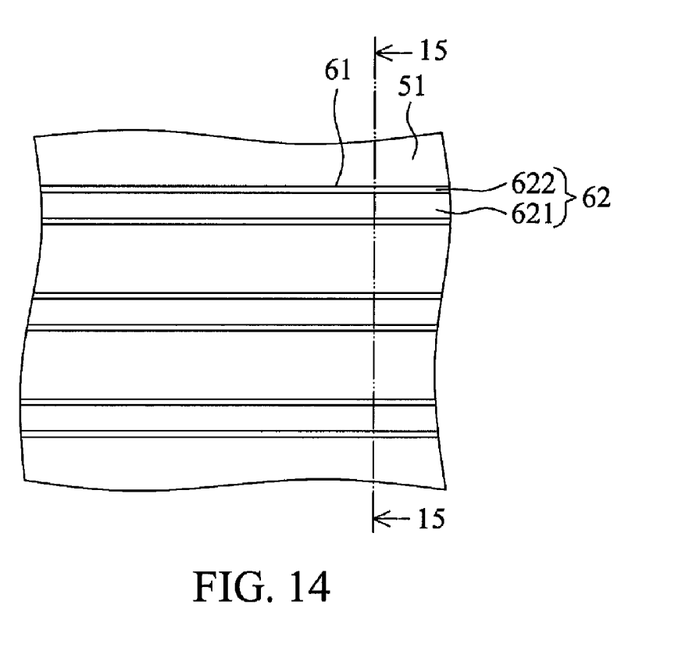
Figure 15:
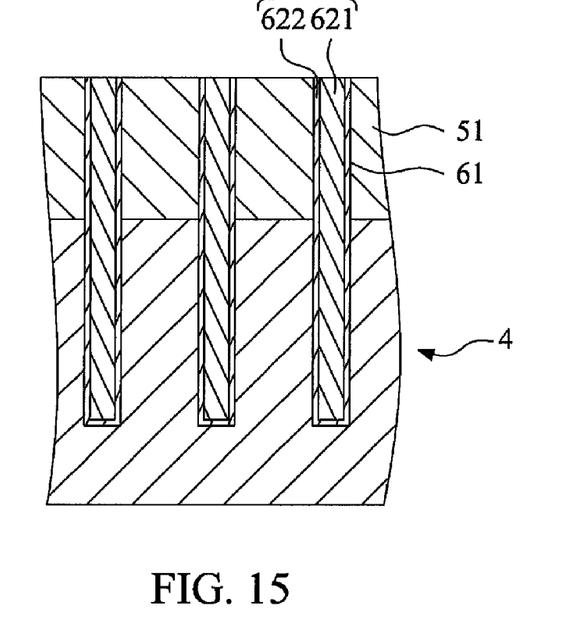

Referring to FIGS. 14 and 15, a second material 62 is formed in the second recesses 61. It should be noted that FIG. 15 is a cross-sectional view of FIG. 14 taken along line 15-15. The second material 62 includes a liner layer 622 and a center oxide 621. In this embodiment, the liner layer 622 includes a liner oxide layer and a liner nitride layer.

Figure 16:
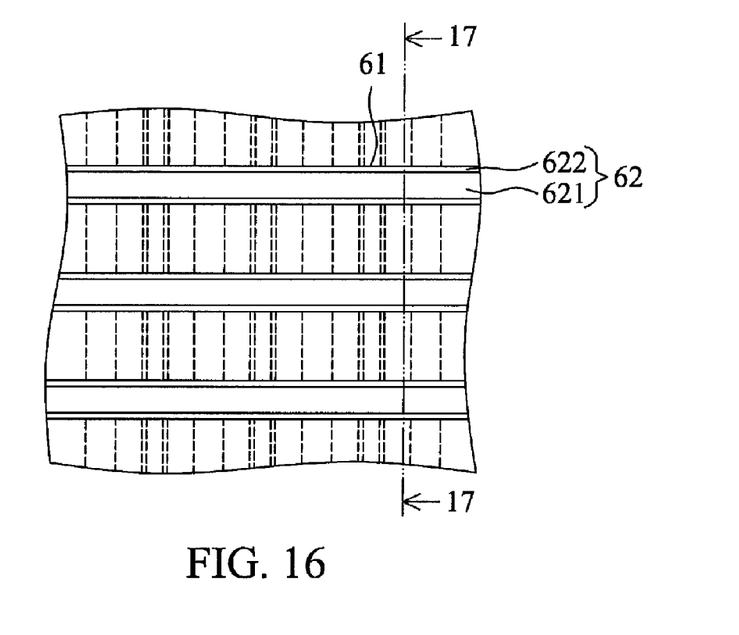
Figure 17:
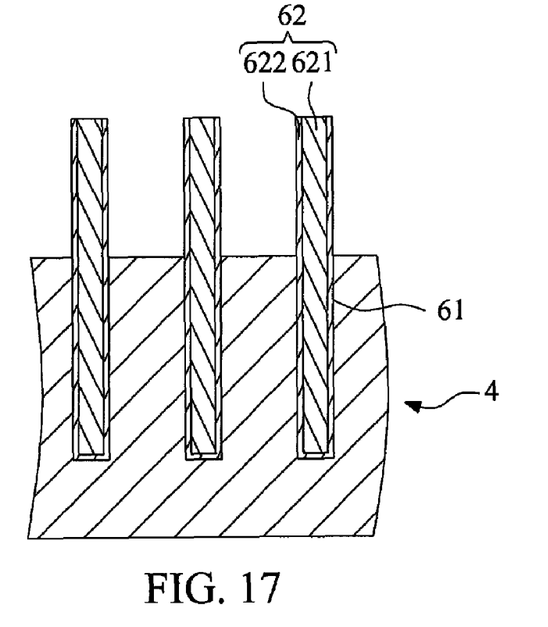

Referring to FIGS. 16 and 17, the first covering layer 51 is removed so that the second material 62 protrude from the base material 4. It is to be noted that FIG. 17 is a cross section view of FIG. 16 taking along line 17-17.

Figure 18:
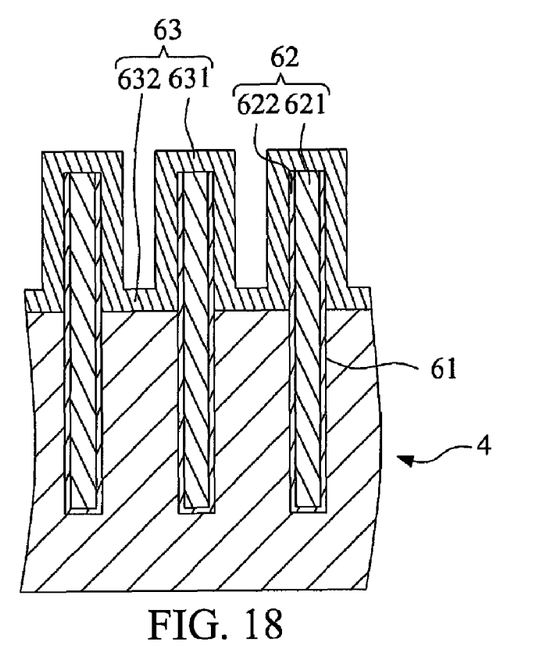

Referring to FIG. 18, a metal layer 63 is formed on the protruded second material 62 and the base material 4. The metal layer 63 includes a first portion 631 and a second portion 632. The first portion 631 covers the protruded second material 62, and the second portion 632 covers the base material 4.

Figure 19:
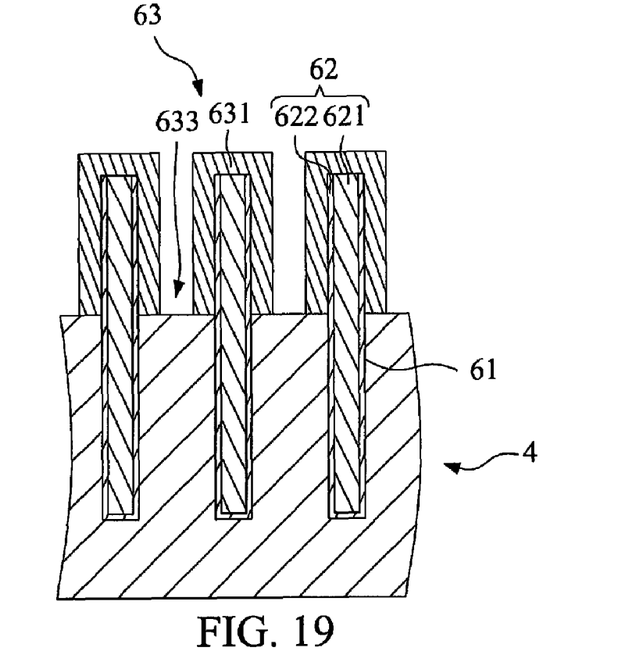

Referring to FIG. 19, the second portion 632 of the metal layer 63 is removed to form a plurality of metal layer openings 633 so as to expose the base material 4.

Figure 20:
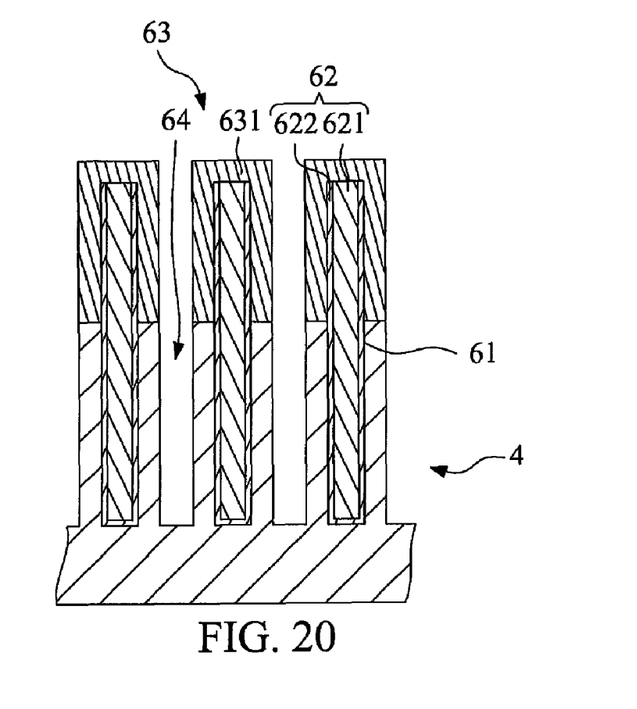

Referring to FIG. 20, the base material 4 is etched according to the metal layer openings 633 so as to form a plurality of third recesses 64. The third recesses 64 intersect the first recesses 421 and are parallel to the second recesses 61. In this embodiment, the third recesses 64 are perpendicular to the first recesses 421 from a top view.

In FIG. 19, the second portion 632 of the metal layer 63 can be removed by the following four methods, but the present invention is not thus limited.

Figure 21:
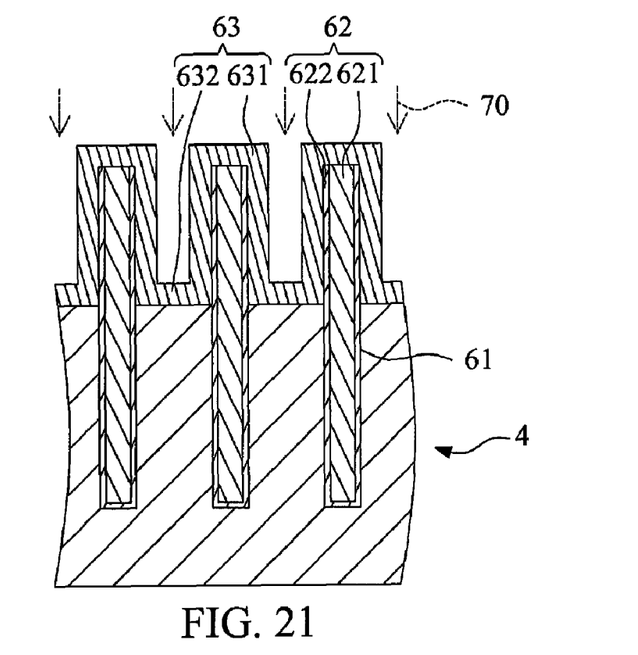

The first method is described as follows. Referring to FIG. 21, an etching gas 70 and an oxygen gas are applied to the metal layer 63 at the same time. The concentration of the oxygen gas reduces gradually with the height of the first portion 631, and the concentration of the oxygen gas on the top surface of the second portion 632 of the metal layer 63 is zero. In this method, the etching gas 70 is a sulfur hexafluoride ($SF_6$) gas or a nitrogen trifluoride ($NF_3$) gas. Therefore, the first portion 631 is oxidized and will not be etched by the etching gas 70, and the second portion 632 is not oxidized and will be etched by the etching gas 70.

Figure 22:
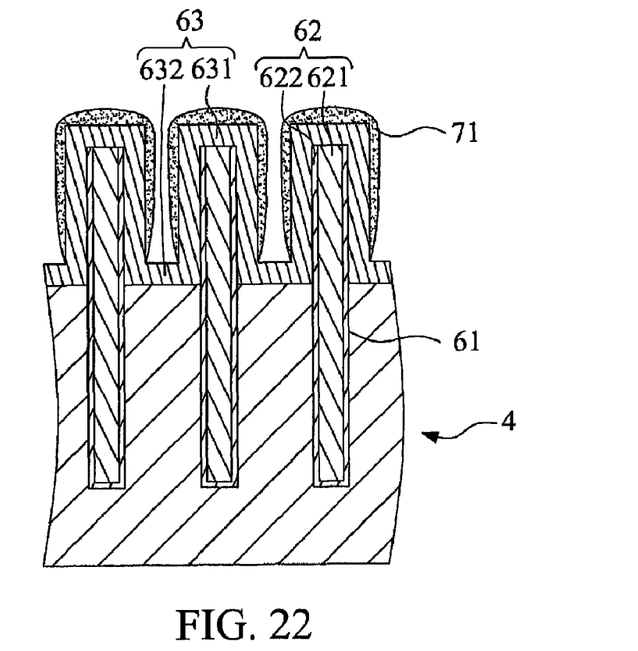

The second method is described as follows. Referring to FIG. 22, a polymer layer 71 is formed to cover on the first portion 631 of the metal layer 63, wherein the polymer layer 71 does not cover the second portion 632 of the metal layer 63. The polymer layer 71 is used for protecting the first portion 631 during the following etching process. Next, an etching gas (such as a sulfur hexafluoride ($SF_6$) gas or a nitrogen trifluoride ($NF_3$) gas) is applied to the metal layer 63 to etch the second portion 632 of the metal layer 63.

Figure 23:
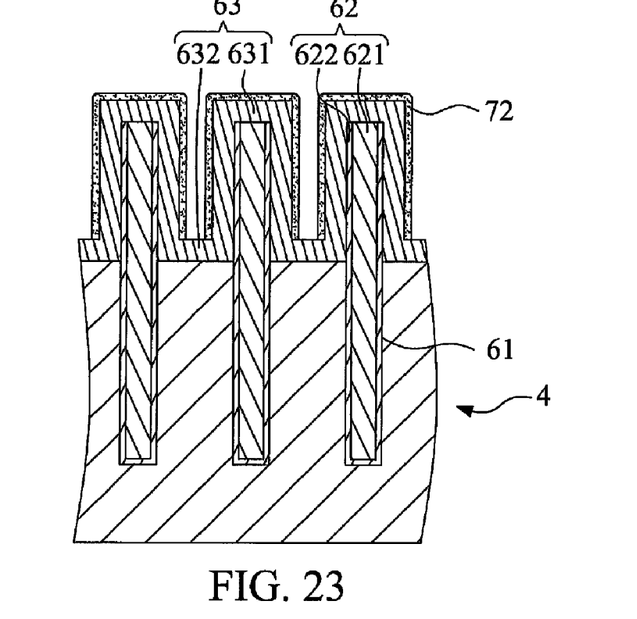

The third method is described as follows. Referring to FIG. 23, a silicon dioxide ($SiO_2$) layer 72 is formed on the side wall of the first portion 631 of the metal layer 63, wherein the silicon dioxide layer 72 does not cover the second portion 632 of the metal layer 63. In this method, the silicon dioxide layer 72 is formed by the reaction of silicon tetrachloride ($SiCl_4$) gas and oxygen gas. The silicon dioxide layer 72 is used for protecting the first portion 631 during the following etching process. Then, an etching gas (such as a sulfur hexafluoride ($SF_6$) gas or a nitrogen trifluoride ($NF_3$) gas) is applied to the metal layer 63 to etch the second portion 632 of the metal layer 63.

Figure 24:
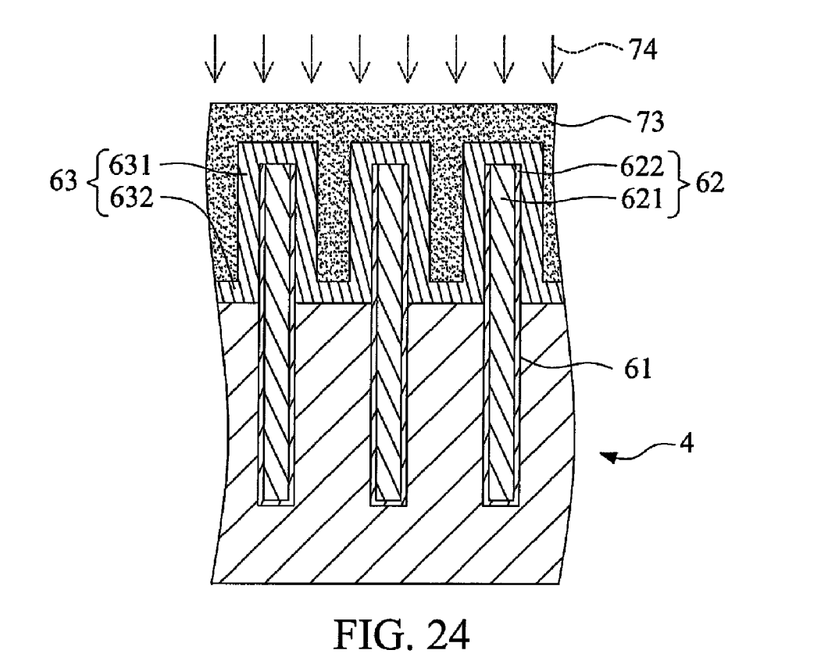
Figure 25:
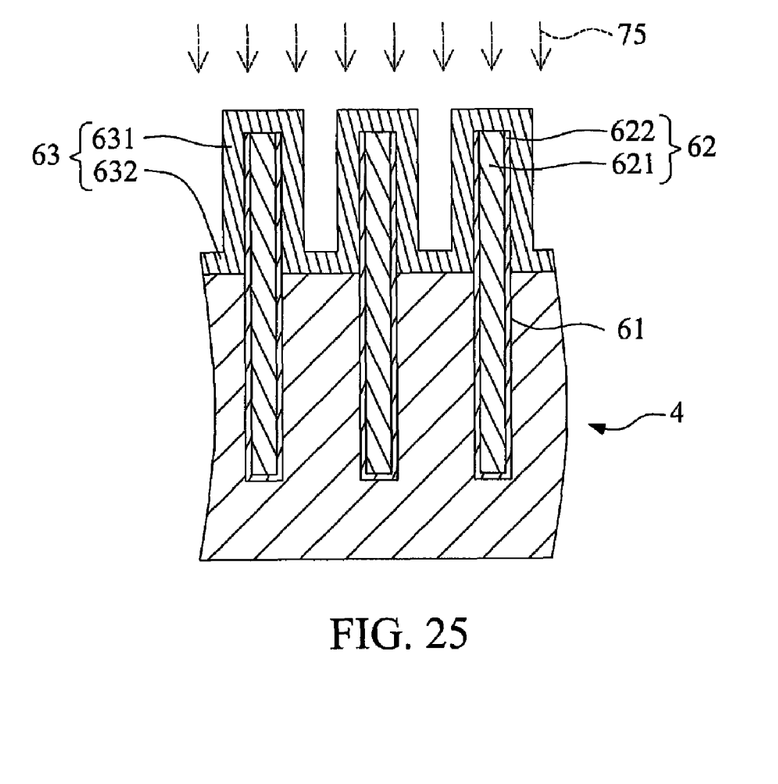

The fourth method is described as follows. Referring to FIG. 24, a photoresist layer 73 is formed on the metal layer 63 to cover the first portion 631 and the second portion 632 of the metal layer 63. Next, a first etching gas 74 and an oxygen gas are applied to the photoresist layer 73. The first etching gas 74 is used for stripping the photoresist layer 73 to expose the first portion 631 of the metal layer 63 gradually, and the exposed first portion 631 is oxidized by the oxygen gas. In this method, the first etching gas 74 is a nitrogen gas. Next, the first etching gas 74 and the oxygen gas are stopped when the whole first portion 631 is oxidized. Next, a second etching gas 75 is applied to the metal layer 63 to etch the second portion 632 of the metal layer 63. In this method, the second etching gas 75 is a sulfur hexafluoride ($SF_6$) gas or a nitrogen trifluoride ($NF_3$) gas. Therefore, the oxidized first portion 631 will not be etched by the second etching gas 75, and the second portion 632 will be etched by the second etching gas 75.

Figure 26:
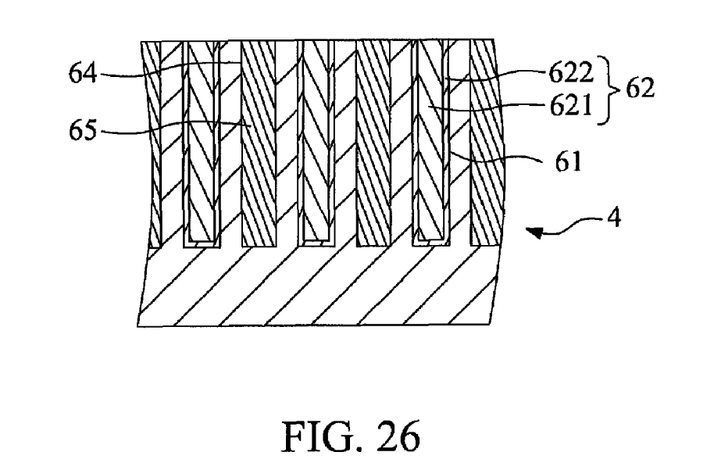

Referring to FIG. 26, the method of the present invention further comprises a step of forming a third material 65 in the third recesses 64. In this embodiment, the protruded second material 62 and the metal layer 63 are removed. Next, a third material 65 is formed in the third recesses 64. The third material 64 is oxide.

In the present invention, the metal layer 63 can overcome the non-selectivity issue during the etching process of FIG. 20, and the first portion 631 of the metal layer 63 does not need to be very tall to resist the etching gas. Further, the thickness of the first portion 631 provides the to additional mask thickness during the etching process.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a recess array device structure in a semiconductor substrate, comprising:
   providing a base material comprising a semiconductor substrate and a first material, the semiconductor substrate having a plurality of first recesses, the first material being disposed in the first recesses, and the first material being different from the semiconductor substrate;
   forming a plurality of second recesses on the semiconductor substrate, wherein the second recesses intersect the first recesses;
   forming a second material in the second recesses, wherein the second material protrudes from the base material;
   forming a metal layer on the protruded second material and the base material, wherein the metal layer includes a first portion and a second portion, the first portion covers the protruded second material, and the second portion covers the base material;
   removing the second portion of the metal layer to form a plurality of metal layer openings so as to expose the base material; and
   etching the base material according to the metal layer openings so as to form a plurality of third recesses, wherein the third recesses intersect the first recesses and are parallel to the second recesses.

2. The method of claim 1, wherein the semiconductor substrate is silicon and the first material is oxide.

3. The method of claim 1, wherein the base material further comprises an interlaying material, the semiconductor substrate further has a plurality of interlaying recesses, the interlaying recesses are parallel to the first recesses, each of the interlaying recesses is disposed between two first recesses, the interlaying material is disposed in the interlaying recesses, and the interlaying material is different from the semiconductor substrate.

4. The method of claim 3, wherein the interlaying material includes a liner oxide layer, a liner nitride layer and a center oxide.

5. The method of claim 1, wherein the second recesses and the second material are formed by the following steps:
   forming a first covering layer on the base material to cover the semiconductor substrate and the first recesses;
   forming a second covering layer on the first covering layer;
   forming a third covering layer on the second covering layer;

forming a photoresist layer on the third covering layer;
patterning the photoresist layer to form a plurality of photoresist layer openings;
etching the third covering layer, the second covering layer, the first covering layer and the base material according to the photoresist layer openings so as to form the second recesses;
removing the photoresist layer, the third covering layer and the second covering layer;
forming the second material in the second recesses; and
removing the first covering layer so that the second material protrudes from the semiconductor substrate.

6. The method of claim 5, wherein the first covering layer is polysilicon, the second covering layer is carbon, and the third covering layer is silicon oxynitride (SiON).

7. The method of claim 1, wherein the second material includes a liner oxide layer, a liner nitride layer and a center oxide.

8. The method of claim 1, wherein the second portion of the metal layer is removed by the following step:
applying an etching gas and an oxygen gas to the metal layer, wherein the concentration of the oxygen gas reduces gradually with height, and the concentration of the oxygen gas on the top surface of the second portion of the metal layer is zero.

9. The method of claim 1, wherein the second portion of the metal layer is removed by the following steps:
covering a polymer layer on the first portion of the metal layer, wherein the polymer layer does not cover the second portion of the metal layer; and
applying an etching gas to the metal layer to etch the second portion of the metal layer.

10. The method of claim 1, wherein the second portion of the metal layer is removed by the following steps:
forming a silicon dioxide layer on the first portion of the metal layer, wherein the silicon dioxide layer does not cover the second portion of the metal layer; and
applying an etching gas to the metal layer to etch the second portion of the metal layer.

11. The method of claim 1, wherein the second portion of the metal layer is removed by the following steps:
forming a photoresist layer on the metal layer to cover the first portion and the second portion of the metal layer;
applying a first etching gas and an oxygen gas to the photoresist layer, wherein the first etching gas is used for stripping the photoresist layer to expose the first portion of the metal layer gradually, and the exposed first portion is oxidized by the oxygen gas;
stopping the first etching gas and the oxygen gas when the whole first portion is oxidized; and
applying a second etching gas to etch the second portion of the metal layer.

12. The method of claim 11, wherein the first etching gas is a nitrogen gas, and the second etching gas is a sulfur hexafluoride ($SF_6$) gas or a nitrogen trifluoride ($NF_3$) gas.

13. The method of claim 1, further comprising a step of forming a third material in the third recesses.

14. The method of claim 13, wherein the third material is oxide.

* * * * *